US011072867B2

(12) United States Patent
Lee et al.

(10) Patent No.: US 11,072,867 B2
(45) Date of Patent: Jul. 27, 2021

(54) SURFACE MECHANICAL ATTRITION TREATMENT (SMAT) METHODS AND SYSTEMS FOR MODIFYING NANOSTRUCTURES

(71) Applicant: City University of Hong Kong, Kowloon (HK)

(72) Inventors: Christopher Michael Lee, Kowloon (HK); Yang Yang Li, Kowloon (HK); Jian Lu, Kowloon (HK)

(73) Assignee: CITY UNIVERSITY OF HONG KONG, Kowloon (HK)

( * ) Notice: Subject to any disclaimer, the term of this patent is extended or adjusted under 35 U.S.C. 154(b) by 629 days.

(21) Appl. No.: 15/723,822

(22) Filed: Oct. 3, 2017

(65) Prior Publication Data
US 2018/0030609 A1 Feb. 1, 2018

Related U.S. Application Data

(62) Division of application No. 14/632,864, filed on Feb. 26, 2015, now Pat. No. 9,809,893.

(51) Int. Cl.
*B21D 31/06* (2006.01)
*C25D 11/00* (2006.01)
(Continued)

(52) U.S. Cl.
CPC ........ *C25D 11/005* (2013.01); *C23C 16/4415* (2013.01); *C23C 16/56* (2013.01); *C23C 18/1666* (2013.01); *C25D 11/26* (2013.01)

(58) Field of Classification Search
CPC .... C21D 7/06; B24C 1/10; B24C 3/02; B24C 3/04; B24C 3/32; B24C 5/00; B24C 5/08; B24C 9/00; B21D 31/06
See application file for complete search history.

(56) References Cited

U.S. PATENT DOCUMENTS 3,522,547 A 8/1970 Claiborne, Jr.
3,919,700 A 11/1975 Cozzo et al.
(Continued)

FOREIGN PATENT DOCUMENTS

| CN | 1336445 A | 2/2002 |
| CN | 102119068 A | 7/2011 |
| FR | 2689431 A1 | 10/1993 |

OTHER PUBLICATIONS

"Webster's Ninth New Collegiate Dictionary; Merriam-Webster incorporated, publishers; Springfield, Massachusetts, USA; 1990(no month); p. 126, 215, 395, 1056 & 1280."
(Continued)

*Primary Examiner* — Adam J Eiseman
*Assistant Examiner* — Bobby Yeonjin Kim
(74) *Attorney, Agent, or Firm* — Amin, Turocy & Watson, LLP

(57) ABSTRACT

Described herein are systems and methods for performing a surface mechanical attrition treatment (SMAT) to the surface of a variety of materials including thin films, nanomaterials, and other delicate and brittle materials. In an aspect, a surface of a material is modified to a modified surface and from an original state to a modified state, wherein the modified state comprises a physical modification, a chemical modification, or a biological modification. In another aspect, a surface mechanical attrition treatment (SMAT) is applied to the modified surface of the material for a defined duration of time, wherein a condition associated with the SMAT is adjusted based on a structural composition of the material. In yet another aspect, a defined strain is imposed on the structural composition of the material based on the SMAT.

20 Claims, 11 Drawing Sheets

(51) Int. Cl.
*C25D 11/26* (2006.01)
*C23C 18/16* (2006.01)
*C23C 16/56* (2006.01)
*C23C 16/44* (2006.01)

(56) References Cited

U.S. PATENT DOCUMENTS

| | | | |
|---|---|---|---|
| 5,884,835 A | 3/1999 | Kajiwara et al. | |
| 5,945,642 A | 8/1999 | Nayar et al. | |
| 6,531,100 B1 | 3/2003 | Ogata et al. | |
| 6,598,466 B1 | 7/2003 | Deluca et al. | |
| 6,932,876 B1 | 8/2005 | Statnikov | |
| 7,691,211 B2 * | 4/2010 | Lu | C21D 7/06 148/240 |
| 8,409,367 B2 | 4/2013 | Lu et al. | |
| 9,435,050 B2 | 9/2016 | Li et al. | |
| 9,517,545 B2 * | 12/2016 | Lu | C21D 7/06 |
| 9,518,335 B2 | 12/2016 | Zhang et al. | |
| 9,579,772 B2 | 2/2017 | Lu et al. | |
| 9,670,561 B2 | 6/2017 | Li et al. | |
| 2003/0165638 A1 | 9/2003 | Louks et al. | |
| 2004/0038626 A1 | 2/2004 | Lu et al. | |
| 2004/0190733 A1 | 9/2004 | Nayar et al. | |
| 2004/0245085 A1 | 12/2004 | Srinivasan | |
| 2006/0016858 A1 | 1/2006 | Statnikov et al. | |
| 2008/0282756 A1 * | 11/2008 | Cheppe | B24C 5/005 72/53 |
| 2009/0120048 A1 | 5/2009 | Wertz et al. | |
| 2010/0100188 A1 | 4/2010 | Fuller et al. | |
| 2010/0101686 A1 | 4/2010 | Lu et al. | |
| 2010/0294010 A1 * | 11/2010 | Fujita | B24B 39/006 72/53 |
| 2011/0212185 A1 | 9/2011 | Tanaka et al. | |
| 2011/0214998 A1 | 9/2011 | Li et al. | |
| 2011/0252850 A1 | 10/2011 | Lu | |
| 2012/0225312 A1 | 9/2012 | Chin et al. | |
| 2012/0227454 A1 * | 9/2012 | Fujita | C21D 7/06 72/53 |
| 2014/0175490 A1 | 6/2014 | Suwa et al. | |
| 2015/0033814 A1 | 2/2015 | Lu et al. | |
| 2015/0184309 A1 | 7/2015 | Zhang et al. | |
| 2015/0290696 A1 | 10/2015 | Li et al. | |
| 2016/0031063 A1 | 2/2016 | Lu et al. | |
| 2016/0114462 A1 | 4/2016 | Kecskes et al. | |
| 2016/0258033 A1 | 9/2016 | Lu et al. | |

OTHER PUBLICATIONS

"Darling et al.; ""Enhancing grain refinement in polycrystalline materials using surface mechanical attrition treatment at cryogenictemperatures""; Scripta Materialia; vol. 69, published online Jun. 5, 2013; pp. 461-464."

Office Action dated Nov. 23, 2016 for U.S. Appl. No. 14/632,864, 47 pages.

"Julius Grant, editor; Hackh's Chemical Dictionary, 3rd edition; McGraw-Hili Book Company, incorporated; New York; 1944 (nomonth), excerpt pp. 83-85."

"Webster's Ninth New Collegiate Dictionary; Merriam-Webster incorporated publishers; Springfield, Massachusetts, USA; 1990(no month), excerpt p. 113."

"Richard J Lewis, editor; Hawley's Condensed Chemical Dictionary, 12th edition; Van Nostrand Reinhold company, New York;1993 (no month); excerpts pp. 82, 327, 434, & 683."

"Lerner et al.; Encyclopedia of Physics, 2nd edition; ""Thermoluminescence"" by Paul W Levy; pp. 1264-1272; VCH publishers,incorporated; New York; 1990 (no month)."

Abstract of CN 1026581158; byMo Deqing, assignee Univ Guillin electronic tech; publication date Sep. 12, 2012.

Office Action dated May 3, 2017 for U.S. Appl. No. 14/632,864, 79 pages.

Notice of Allowance dated Jul. 7, 2017 for U.S. Appl. No. 14/632,864, 30 pages.

Chinese Office Action dated Dec. 29, 2018 for Chinese Application Serial No. 201510303226.3, 3 pages.

First Office Action received for Chinese Patent Application Serial No. 201510303226.3 dated Jun. 15, 2018, 15 pages (Including English Translation).

Third Office Action received for Chinese Patent Application Serial No. 201510303226.3 dated Jul. 22, 2019, 8 pages (Including English Translation).

* cited by examiner

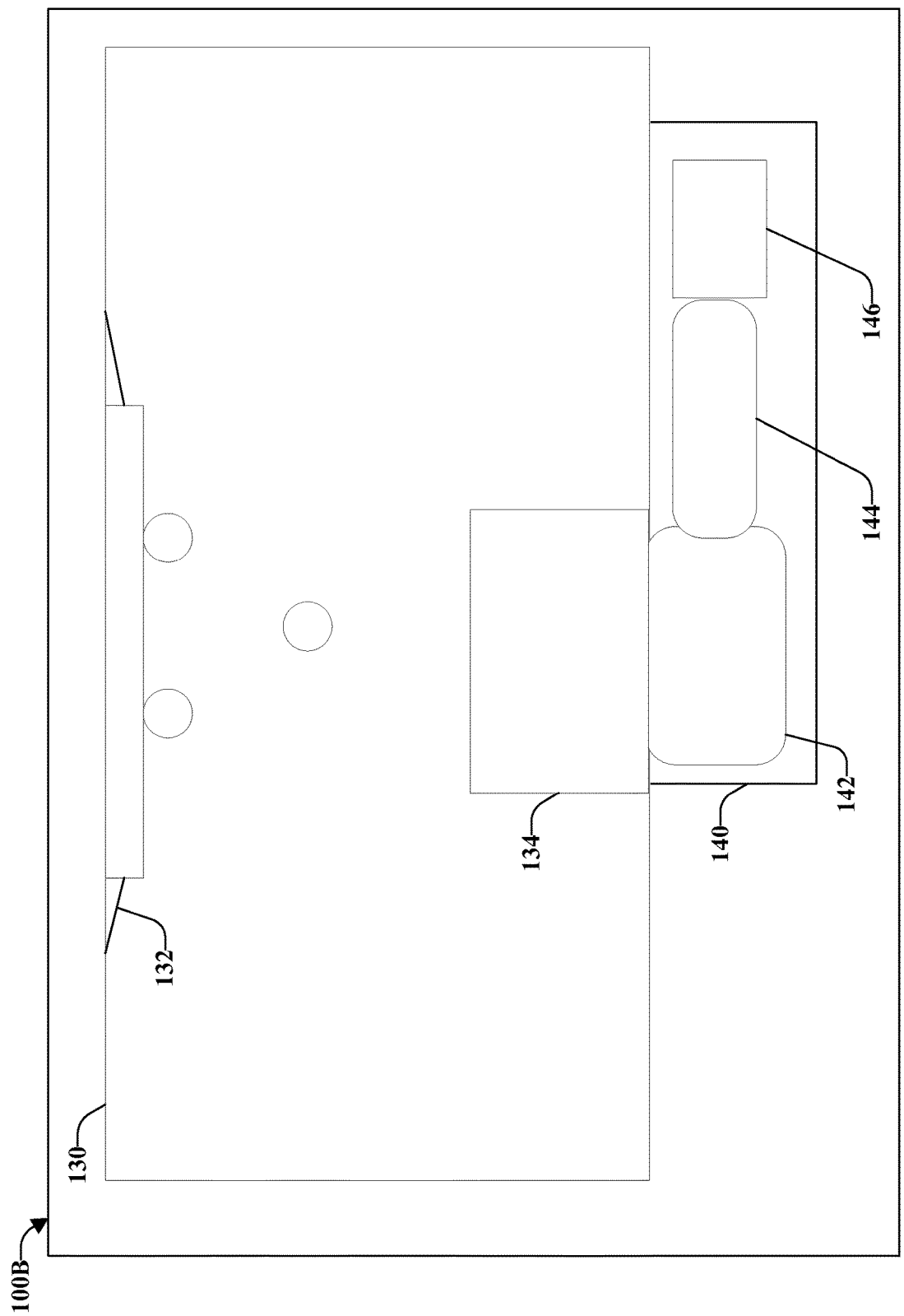

"SURFACE MECHANICAL ATTRITION TREATMENT (SMAT) METHODS AND SYSTEMS FOR MODIFYING NANOSTRUCTURES"

RELATED APPLICATION

The subject application is a divisional of, and claims priority to, U.S. patent application Ser. No. 14/632,864, filed Feb. 26, 2015, and entitled "SURFACE MECHANICAL ATTRITION TREATMENT (SMAT) METHODS AND SYSTEMS FOR MODIFYING NANOSTRUCTURES," the entirety of which application is hereby incorporated by reference herein.

TECHNICAL FIELD

This disclosure relates generally to surface mechanical attrition treatment (SMAT) methods utilized to induce strain at the surface of a range of materials.

BACKGROUND

Recently, the discipline of material science has shown a range of advancements in the area of surface engineering of materials. One such advancement relates to a mechanism known as surface mechanical attrition treatment (SMAT). The SMAT is accomplished by colliding balls with the surface of a material, resulting in the creation of surface imperfections and material strain. Although current SMAT methods can achieve material imperfections, such imperfections transform the surface of the material as well as the deeper sub-surface material layers. However, current SMAT approaches are unable to induce strain on the surface of delicate materials.

Unfortunately, current SMAT and doping methods, such as high energy SMAT and ball milling processes, achieve material doping or strain by impacting the materials in a concentrated and destructive manner that are not effective at creating strain on the surface of thin films or other delicate structures (e.g., nanostructures). Instead, the prevailing SMAT methods effectuate strain throughout the entirety of bulk materials not only the surface of such materials. Other doping methods, such as methods that utilize bending processes to achieve material strain, are also unable to achieve doping or surface strain of delicate materials and often lead to undesired outcomes such as bending the treated films, creating shear strains on the material, or delaminating films from substrates. Accordingly, there is a significant need for technologies and processes to overcome the inability to impose surface strain on delicate materials such as thin films and nanostructures. Furthermore, there is a need for methods to produce surface strain in brittle materials by mass-scale production at efficient costs.

The above-described background relating to SMAT methods for various materials is merely intended to provide a contextual overview of SMAT methods and its current limitations, and is not intended to be exhaustive. Other context regarding traditional SMAT methods may become further apparent upon review of the following detailed description.

SUMMARY

A simplified summary is provided herein to help enable a basic or general understanding of various aspects of exemplary, non-limiting embodiments that follow in the more detailed description and the accompanying drawings. This summary is not intended, however, as an extensive or exhaustive overview. Instead, the purpose of this summary is to present some concepts related to some exemplary non-limiting embodiments in simplified form as a prelude to more detailed descriptions of the various embodiments that follow in the disclosure.

Described herein are systems, methods, articles of manufacture, and other embodiments or implementations that provide functionality, provide doping, and induce strain on the surface of delicate or brittle materials such as thin films or nanomaterials. In an embodiment, a system is provided comprising: an anodization component, a heating component, a chamber component, and an ultrasonic vibration generator component. In an aspect, an anodization component passes a current through a surface of a material to anodize the surface of the material. In another aspect, a heating component applies heat according to a defined temperature to the surface of the material. Furthermore, in an aspect, a chamber component comprises a material housing portion, a receptacle portion, and an ultrasonic vibration generator component.

In an aspect, a material housing portion is connected to a ceiling of the chamber component and the material housing portion holds the material, wherein the surface of the material faces towards a floor of the chamber component, the receptacle portion is connected to the floor of the chamber component, wherein the receptacle portion comprises a set of balls, wherein the ultrasonic vibration generator component is connected to the receptacle portion, wherein the ultrasonic vibration generator component comprises a power generator component that converts a power stream to an electrical signal, a converter component converts the electrical signal to an oscillating wave, and a horn component emits the oscillating wave corresponding to a vibrational frequency, the oscillating wave impacts the set of balls resulting in scattered dispersion of the set of balls, and the set of balls collide with the surface of the material at a defined speed.

In another embodiment, disclosed is a method, comprising: applying an anodization treatment to a surface of a material, applying a heat treatment to the surface of the material; applying a surface mechanical attrition treatment (SMAT) to the surface of the material, wherein the SMAT comprises: arranging a ball between the surface of the material and an ultrasonic horn connected to an ultrasonic transducer configured to convert an electrical signal into an oscillating wave, wherein the ultrasonic horn is configured to emit the oscillating wave; emitting, by the ultrasonic horn, the oscillating wave representing a frequency level; inducing movement of the ball based on a contact between the oscillating wave and the ball; and colliding the ball with the surface of the material based on an induced movement of the ball, wherein the colliding alters the surface of the material to comprise at least one of a material strain, a deformation of the surface, a compressive stress throughout the material, or an indentation of the surface.

To the accomplishment of the foregoing and related ends, the subject disclosure then, comprises the features hereinafter fully described. The following description and the annexed drawings set forth in detail certain illustrative aspects. However, these aspects are indicative of but a few of the various ways in which the principles disclosed herein may be employed. Other aspects, advantages and novel features will become apparent from the following detailed description when considered in conjunction with the drawings.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

FIG. 1B illustrates a non-limiting schematic block diagram of an example SMAT system comprising a chamber component, a material housing portion, a receptacle portion, an ultrasonic vibration generator component, a horn component, a converter component, and a power generator component.

DETAILED DESCRIPTION

Figure 1A:
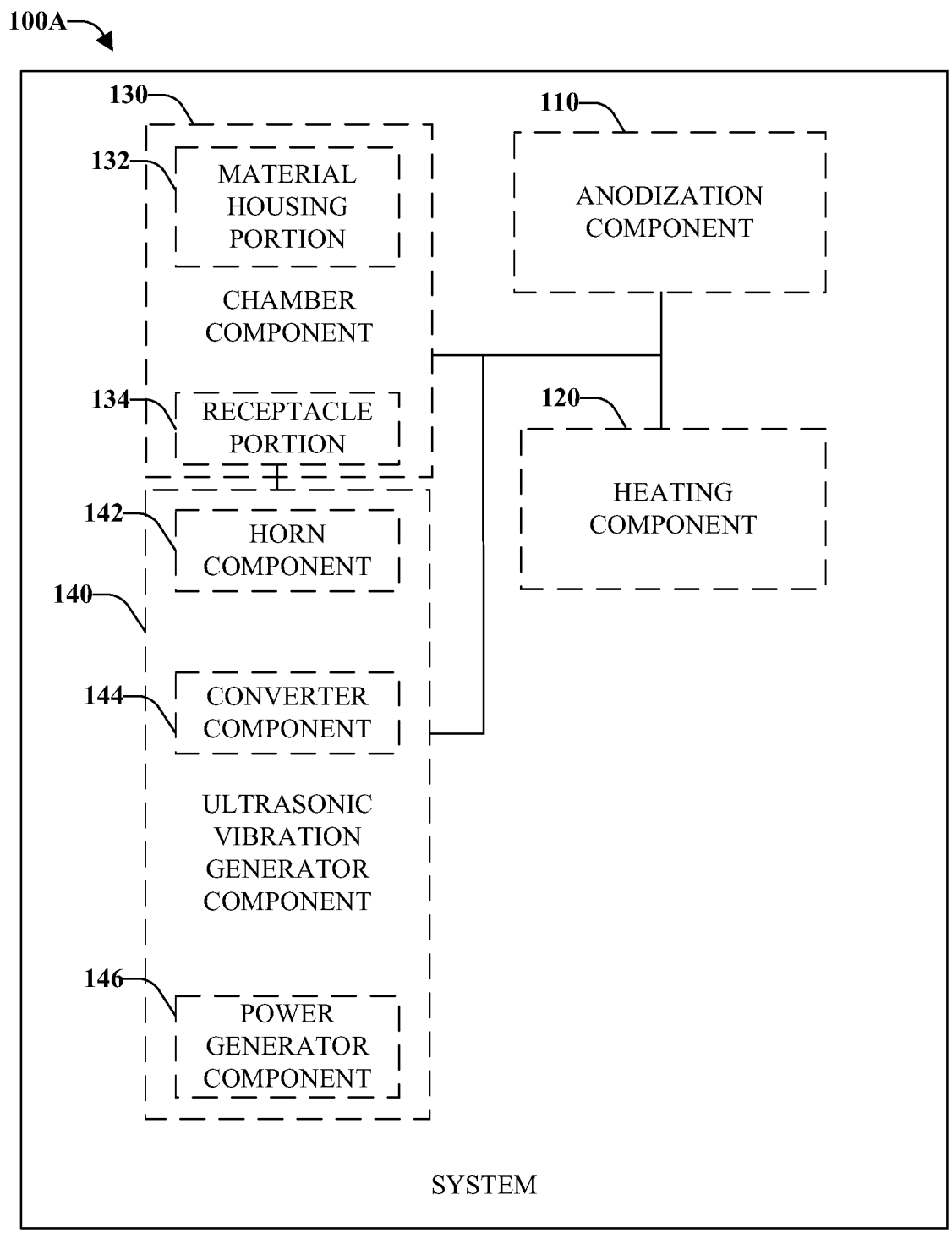
FIG. 1A illustrates a non-limiting schematic block diagram of an example SMAT system comprising an anodization component, a heating component, a chamber component, and an ultrasonic generator component.

In the following description, numerous specific details are set forth to provide a thorough understanding of various embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment," or "an embodiment," means that a particular feature, structure, or characteristic described in connection with the embodiment is included in at least one embodiment. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in one or more embodiments.

As utilized herein, terms "component," "system," "interface," and the like are intended to refer to an apparatus with specific functionality provided by mechanical parts operated by electric or electronic circuitry; the electric or electronic circuitry can be operated by a software application or a firmware application executed by one or more processors; the one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components. In an aspect, a component can emulate an electronic component via a virtual machine, e.g., within a cloud computing system.

The words "exemplary" and/or "demonstrative" are used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

As an overview of the various embodiments presented herein, to correct for the above identified deficiencies and other drawbacks of current SMAT processes, various embodiments are described herein to facilitate doping, functionalization, or creation of structural strain on the surface of brittle and delicate materials such as thin films or nanomaterials via disclosed SMAT methods. The disclosed SMAT systems and methods describe a functional SMAT process to achieve tailored structural modifications to a material surface. For instance, the disclosed SMAT systems and methods facilitate the altering and fine-tuning of SMAT parameters to create structural defects on the surface of the material that can range from severe (defects in the millimeter to sub-millimeter range) to very fine (imposing structural strain along lattice plains observed at the micron to sub-micron range).

Conventional SMAT processes are mechanical techniques that do not provide the conditions or processes to create strain on the surface of delicate materials within very fine ranges. The disclosed SMAT methods can create strain at the surface of bulk materials without effecting deeper layers of the bulk materials. Furthermore, the SMAT introduces imperfections, deformities and modifications to the material surface that enhance the properties and behaviors of the material. For instance, the SMAT methods can introduce defects and create lattice strain at the surface layer of a target material, thereby functionalizing and enhancing charge-trapping properties of the surface layer. These improvements can enhance the capability of a material to perform specialized functions such as photocatalysis which is a central function required by a range of applications including, but not limited to: solar cells, solar-based water disinfection devices, self-sterilizing photocatalytic-based coatings, various water-splitting technologies, and super capacitor technologies. Accordingly, the disclosed subject matter describes SMAT processes and the beneficial impact of using SMAT to create strain and defects on the surface of delicate materials as well as improve functionality of such materials.

Referring now to FIG. 1A, illustrated are schematics of an example SMAT system 100A. In an aspect, system 100A employs an anodization component 110 that passes a current through a surface of a material to anodize the surface of the material; a heating component 120 that applies heat according to a defined temperature to the surface of the material; and a chamber component 130 that comprises a material housing portion 132, a receptacle portion 134, and an ultrasonic vibration generator component 140, wherein the material housing portion 132 is connected to a ceiling of the chamber component 130 and the material housing portion 132 holds the material, wherein the surface of the material faces towards a floor of chamber component 130, wherein receptacle portion 134 is connected to the floor of chamber component 130, wherein receptacle portion 134 comprises a set of balls, wherein ultrasonic vibration generator component 140 is connected to receptacle portion 134, wherein ultrasonic vibration generator component 140 comprises a power generator component 146 that converts a power stream to an electrical signal, a converter component 144 that converts the electrical signal to an oscillating wave, and a horn component 142 that emits the oscillating wave corresponding to a vibrational frequency, wherein the oscillating wave impacts the set of balls resulting in scattered dispersion of the set of balls, and wherein the set of balls collide with the surface of the material at a defined speed.

The SMAT system 100A describes a SMAT of a material surface wherein the material can be any variety of materials. The materials can vary in properties, physical composition, size, and shape. For instance, the material can be a thin film material, a nanomaterial, a charge trapping material, a nanostructured material, or a metal oxide material. The material can be a material treated in a certain manner such as an anodized material. For instance, the material can be an anodic oxide material resulting from anodizing metal substrates via conventional processes. The anodized material can also comprise a surface layer of oxide nanotubes grown on the metal substrate. As such, in an aspect, an anodization component 110 can anodize the surface of the material using any number of anodization processes including, but not limited to, sulfuric acid anodizing processes, oxalic acid anodizing processes, phosphoric acid anodizing processes, and other such processes. In an aspect, anodization component 110 can perform other processing techniques (in lieu of anodization) in order to structure the material. For instance, anodization component 110 can perform physical vapor deposition treatment of a material to deposit thin films onto the material. In another aspect, anodization component 110 can coat materials using a range of coating techniques including, but not limited to, evaporative deposition, pulsed laser deposition, sputter deposition, cathodic arc deposition, and other such coating processes.

In another aspect, system 100A can employ a heating component 120 that applies heat to the material or the anodized material. In an aspect, the application of heat to the material can alter the physical properties or chemical properties of the material or the anodized material. The heat treatment can be applied to the material before the material is anodized, after the material is anodized or even in the absence of anodization of the material. The treatment with heat can impact the material by inducing a formation of crystalline structures on the material surface thereby increasing the electrochemical properties of the material. In an aspect, heat treatment of the material prior to anodization can slow the growth of film thickness during anodization. In another aspect, heating component 120 can apply any variety of heat treatment techniques to the material or the anodized material including annealing, case hardening, precipitation strengthening, tempering, or quenching. Furthermore, the heat applied to the surface of the material can be adjusted to a defined temperature in order to bring about tailored characteristics of the respective material.

In yet another aspect, system 100A can employ a chamber component 130 that comprises a material housing portion 132, a receptacle portion 134, and an ultrasonic vibration generator component 140. Turning to FIG. 1B, illustrated is a non-limiting embodiment of system 100B that illustrates a chamber component 130 and ultrasonic vibration generator component 144 in a non-limiting embodiment. The chamber component 130 is an enclosure that contains the elements associated with the SMAT. The chamber can take a range of shapes such as a cylinder, a cube, a cone, a sphere, a pyramid, a cuboid, a triangular prism, a hexagonal prism, a hemisphere, a dodecahedron, an irregular three dimensional shape, a flat-topped three dimensional shape, or other predefined three-dimensional shape. In an embodiment, the chamber can take the shape of a rectangle comprising a length, width, height and volume. In an aspect, chamber component 130 can be a rectangular parallelepiped comprising a floor, a ceiling, and four sidewalls. In an aspect, a material housing portion 132 is connected to a ceiling of the rectangular parallelepiped wherein the housing portion 132 holds the material in place such that the surface of the material faces towards the floor of chamber component 130.

Furthermore, in an aspect, the floor of the chamber is connected to a receptacle portion 134 that comprises a set of balls. In an aspect, the set of balls can be comprised of various materials such as metals (e.g., steel, chrome, aluminum, etc.), stainless steel, flint, tungsten, rubber, glass, ceramics, or plastics. Also, the balls can be composed of or coated with specifically engineered materials for use in depositing onto a sample. In another aspect, the balls can vary in sizes and shapes (e.g., spherical balls, eclipse balls, cylinder balls, ball-cones, etc.). The set of balls are utilized as tools to facilitate the doping of the material via impacting the material surface. The set of balls are contained in a receptacle portion 134 and receptacle portion 134 is connected to an ultrasonic vibration generator component 144.

In an aspect, ultrasonic vibration generator component 144 comprises a power generator component 146 that converts a power stream to an electrical signal, a converter component 144 that converts the electrical signal to an oscillating wave, and a horn component 142 that emits the oscillating wave corresponding to a vibrational frequency. An ultrasonic vibration generator component 144 comprises various elements such as a power supply (e.g., power generator component 146), a converter (e.g., converter component 144), a booster, and a horn (e.g., horn component 142). In an aspect, a power generator component 146 converts a stream of electrical energy into a higher energy electrical signal. For instance, a power supply can source power measuring 40-60 hertz (Hz) and convert such power into electrical energy measuring 10-50 kilohertz (kHz). In another aspect, a power generator component 146 can convert alternating current voltage into electrical energy.

Another element of an ultrasonic generator component 144 can be a converter component 144, which transforms the electrical energy (e.g., generated by a power generator component 146) from the power supply into mechanical vibrations. A converter component 144 can comprise a material (e.g., lead zirconate titanate material) that expands and contracts at a resonant frequency in response to excitement from electrical energy (e.g., sourced by a power generator component 146). In another aspect, an ultrasonic generator component 144 comprises a horn component 142 (e.g., an ultrasonic horn), which transfers mechanical vibratory energy from a converter component 144 to the outside environment. As ultrasonic horn component 142 emits a vibration at a resonant frequency (e.g., a frequency that results from the characteristics of the horn and mechanical vibratory energy), the two ends of the horn lengthen and shorten in opposite directions. The amplitude of a vibrational wave emitted from the horn can vary based on the material composition of the horn, the type of horn assembly (e.g., a welded horn assembly or staked component assembly to form an ultrasonic generator component 144), and the shape of the horn.

As horn component 142 emits a vibration or oscillating wave corresponding to a vibrational frequency, the oscillating wave impacts the set of balls resulting in dispersion of the set of balls within chamber component 130. In an aspect, material housing portion 132 is connected to a ceiling of chamber component 130 and material housing portion 132 holds the material in place such that the surface of the material faces towards a floor of chamber component 130. Furthermore, the dispersed set of balls collides with the surface of the material at a defined speed and such collisions impact the stationary (e.g., stationed by material housing portion 132) surface of the material thereby doping and creating imperfections on the surface of the material. The impact of the set of balls with the surface of the material creates strain such as lattice strain that improves the functionality of the material. Furthermore, in an aspect, the doping of the surface of the material can be tuned and customized based on an adjustment of system 100A conditions or features.

For instance, the shape of the chamber or size of the chamber can be adjusted to create a smaller, larger or varied physical environment that houses system 100A components. In an aspect, if chamber component 130 is a sphere, the angle and speed at which the set of balls impact the material surface can be varied in comparison to the angle and speed of impact created in a cuboid chamber component 130. In another aspect, the material composition of the set of balls can impact system 100A conditions such as mass of the set of balls, velocity at which the set of balls collide with the surface of the material, speed at which the set of balls move in combination with a vibrational frequency of an oscillating wave. In an aspect, system 100A can apply SMAT at lower powers, which can be scaled down to transform lattice formations and crystal orientations at the surface of thin films and other brittle materials.

Furthermore, in an aspect, the set of balls can be coated such that they act as carriers of functional structures to functionalize the surface of the material. For instance, the set of balls can be coated with active metals for doping the surface of the material such as Fe, W, V, or Cr. These active metals can instill photocatalytic properties to the surface of the material via SMAT processes. In another instance, photocatalytic non-metals can be coated on the set of balls for doping the surface of the material, such non-metals comprising N, P, or S. Furthermore, in an aspect, heat component 120 can apply a heat treatment (at lower temperatures due to the SMAT treatment via coating) to the material surface, which can incorporate the deposited materials (e.g., metals, non-metals, etc.) throughout the structure of the material. In an aspect, the disclosed SMAT doping process can create functional material surfaces on the surface of a nanomaterial. In an embodiment, the SMAT process can create increased strain as well as the inclusion of dopants (e.g., iron) in a material surface.

The benefits of this process include the ability to impose strain on the surface of brittle and delicate materials by effecting process parameters such as ball speed (e.g., can achieve a low speed at which the set of balls disperse), force of impact (e.g., can tune the force at which the balls impact the surface of the material by adjusting system 100A conditions), and control over the scatter speed of the set of balls. As a practical benefit, merely ambient conditions are required to implement the SMAT method of processing brittle materials and thin film materials as opposed to the need for clean rooms and excessively complicated control systems as well as vacuums. Furthermore, the process can be implemented on a larger scale to fabricate thin film materials (with surface dopants) with high uniformity, which further benefits material suppliers seeking to exploit the economies of scale associated with mass production of delicate materials with doped surfaces (e.g., exhibiting photocatalytic characteristics). In another aspect, system 100A can provide customized material structures that result from two-dimensional or three-dimensional models, such as wire and tube technology models. Accordingly, system 100A can be applied to a large range of substrate-film materials and is therefore a highly versatile process.

In order to highlight the benefits of system 100A to material surfaces, system 100A was implemented to effectively generate functional $TiO_2$ from an anodized Ti substrate. As a result of the implementation of system 100A, the functional $TiO_2$ has been shown to exhibit the following properties: increased photocatalytic activity as compared with generically produced photoactive anodic $TiO_2$; $TiO_2$ that has been successfully iron doped; reduced band-gap (e.g., demonstrated in a system 100A process that induces strain at the surface of the material and also demonstrated in a system 100A process that induces strain and functionalization at the surface of the material) as compared to the band-gap achieved by a generic photoactive sample of $TiO_2$ produced anodically; and improved ability to split water molecules using system 100A produced $TiO_2$ as compared with generically produced photoactive anodic $TiO_2$. In another aspect, system 100A is effective at producing $TiO_2$ that provides efficacious antibacterial properties at a material surface. Furthermore, in an aspect, system 100A is effective at producing $TiO_2$, which can improve the functionality of supercapacitor electrodes. Another beneficial use of $TiO_2$ produced by system 100A is the creation of functional $TiO_2$ capable of degrading industrial dyes.

Figure 2:
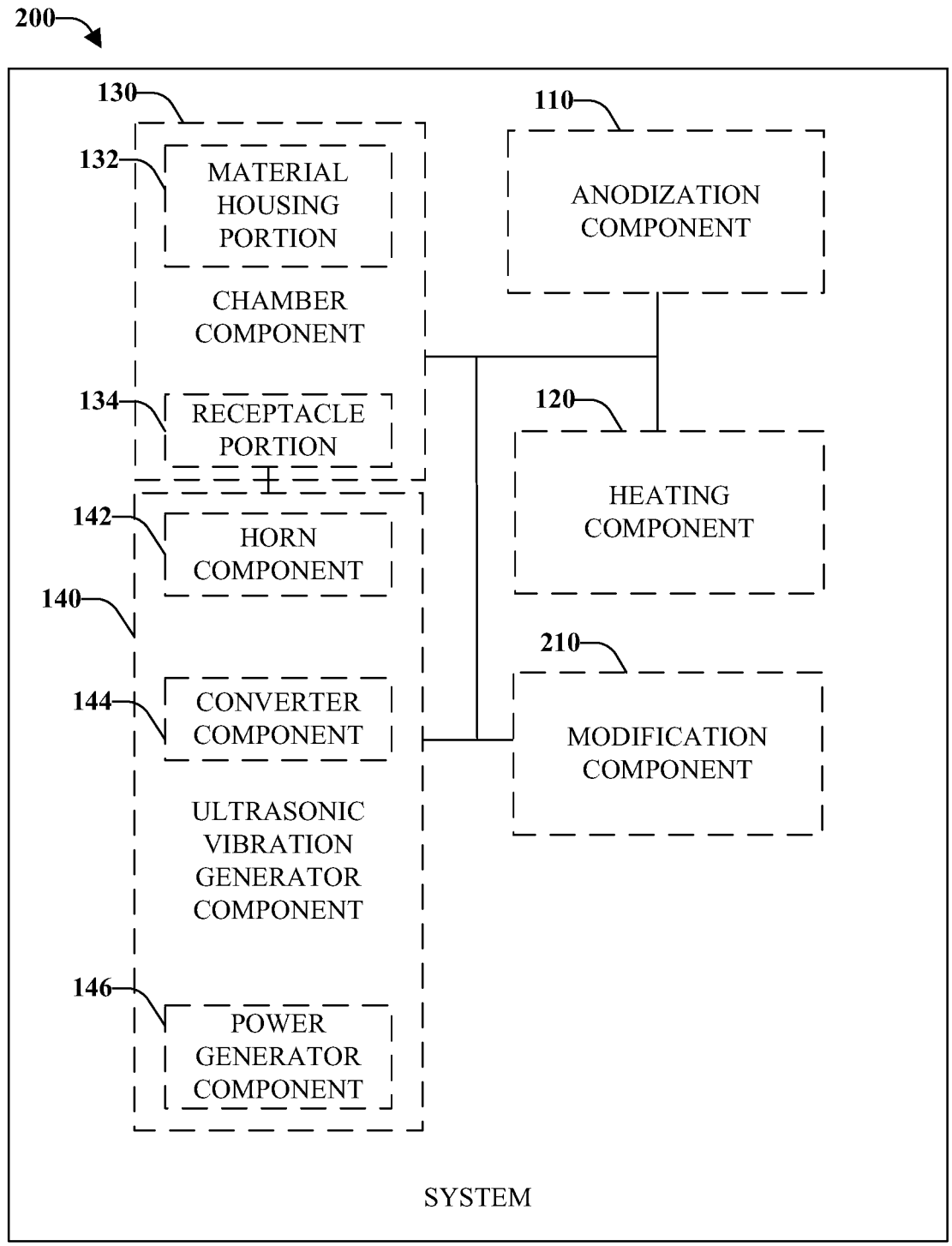
FIG. 2 illustrates a non-limiting schematic block diagram of an example SMAT system comprising an anodization component, a heating component, a chamber component, an ultrasonic generator component, and a modification component.

Turning now to FIG. 2, illustrated is a schematic diagram of an example non-limiting system 200 further comprising a modification component 210 that adjusts a dimension of the chamber shape to achieve the defined speed. In an aspect, chamber component 130 can take the form of a variety of shapes as described above. The various chamber shapes can affect the speed at which the set of balls collide with the surface of the material. In an aspect, the set of balls can ricochet off walls at different angles and at different speeds based on the shape and dimensions of chamber component 130. Furthermore, the force of impact and speed of impact between the set of balls and the surface of the material can also be influenced by the modification (e.g., using modification component 210) of such chamber shapes. Also, the ability to influence the speed of the balls and the resulting collision with the surface of the material leads to the customization of the surface functionalization, induced surface strain, imposed lattice structures, and desired surface doping.

Figure 3:
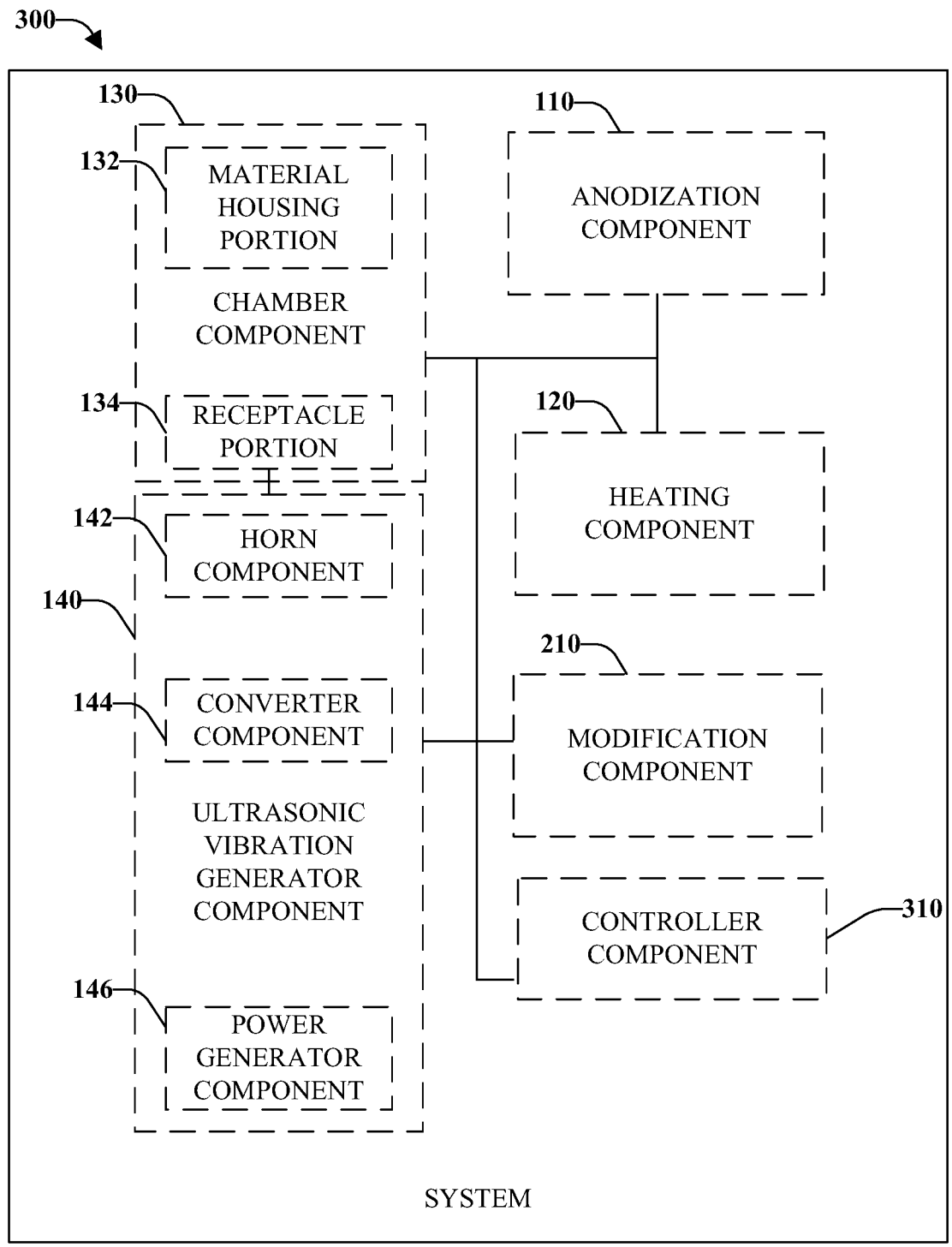
FIG. 3 illustrates a non-limiting schematic block diagram of an example SMAT system comprising an anodization component, a heating component, a chamber component, an ultrasonic generator component, a modification component, and a controller component.

Turning now to FIG. 3, illustrated is a schematic diagram of an example non-limiting system 300 further comprising a controller component 310 that tunes the vibration frequency or the power stream to a corresponding frequency level or power level respectively. In an aspect, the ultrasonic vibration generator component 144 comprises a power generator component 146 that converts a power stream to an electrical signal, a converter component 144 that converts the electrical signal to an oscillating wave, and a horn component 142 that emits the oscillating wave corresponding to a vibrational frequency. The vibrational frequency thereby induces movement of the set of balls at a defined speed, formation of dispersion, and level of scattering (as well as speed of scattering). In an aspect, controller component 310 allows for the tuning of the vibrational frequency by adjusting elements of ultrasonic generator component 144.

For instance, controller component 310 can output a signal to power generator component 146 to govern the frequency level of power to send to converter component 144. Furthermore, in an aspect, controller component 310 can govern the conversion scale that converter component 144 utilizes to convert the electrical signal to an oscillating wave. Furthermore, controller component 310 can send signals to power generator component 146 to trigger an alarm, abort the sending of an electrical signal, or adjust a power to output to converter component 144. In another aspect, controller component 310 can have varying impacts on the vibration frequency or power level emitted or converted respectively by ultrasonic vibration generator component 144 based on the embodiment of ultrasonic vibration generator component 144.

In an instance, horn component 142 of ultrasonic vibration generator component 144 can be any variety of ultrasonic horns such as a bell-shaped horn, a bar-shaped horn, a catenoidal cutting horn, a composite ultrasonic horn, an exponential horn, an inserting horn, a round ultrasonic horn, a tuned bolt-style horn, a vacuum horn, a cross horn, a contoured horn, a welded horn, an elbert horn, a booster horn, a full wave horn, a rotary horn, a balun horn, a side slitting horn, an end slitting horn, or a circular slotted horn. Each respective horn can impact the vibrational frequency emitted in a different manner. For instance, by changing the mass ratio of the horn or by altering the input amplitude of the signal received by the horn, amplitude of the vibrational wave emitted by the horn can be increased or decreased. Furthermore, horn amplitude can also vary based on the horn geometry, horn design, and material composition of the horn. Accordingly, controller component 310 can impact the vibrational frequency emitted by ultrasonic vibration generator component 144 based on the components (e.g., horn component 142) that comprise ultrasonic vibration generator component 144.

Figure 4:
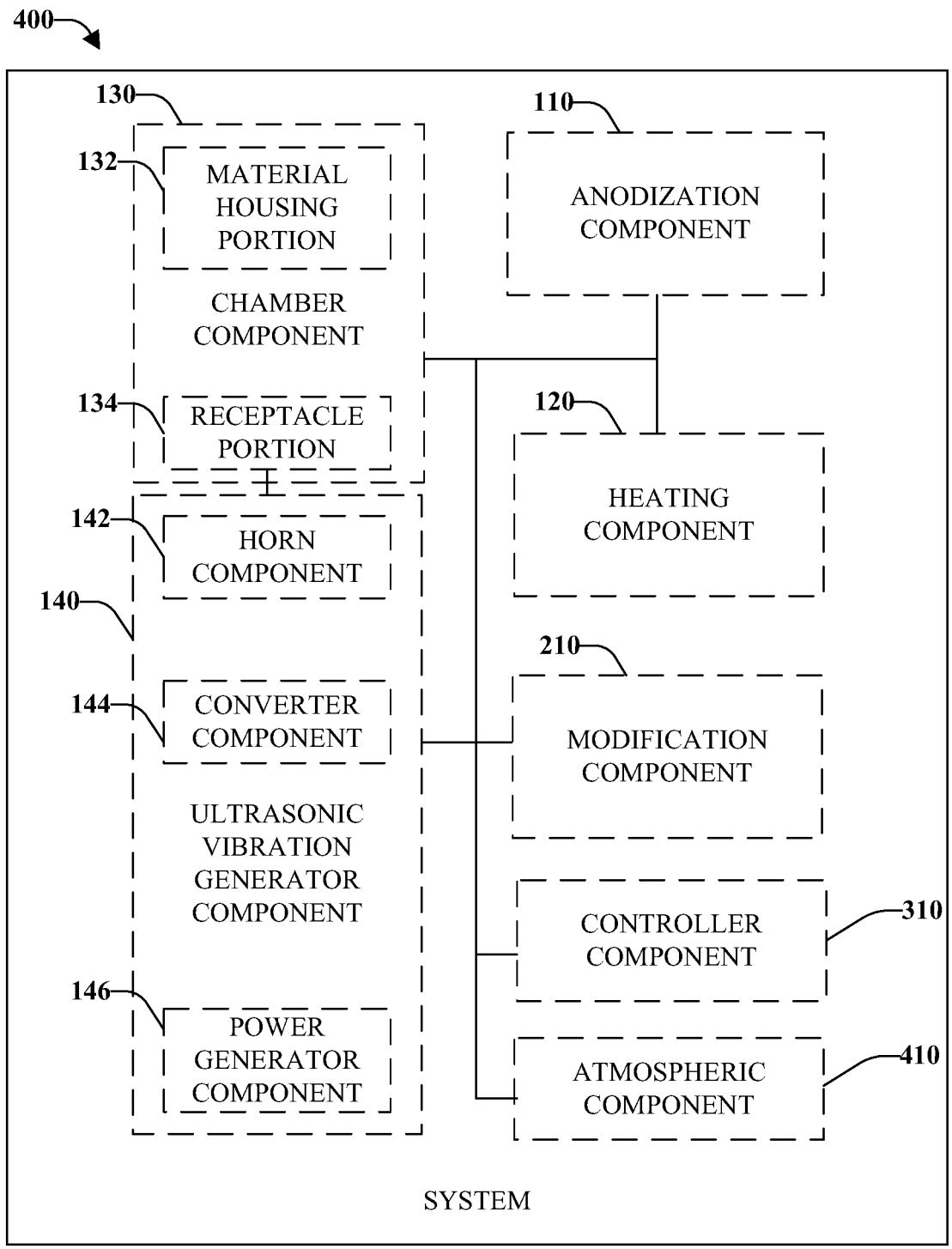
FIG. 4 illustrates a non-limiting schematic block diagram of an example SMAT system comprising an anodization component, a heating component, a chamber component, an ultrasonic generator component, a modification component, and a controller component.

Turning now to FIG. 4, illustrated is a schematic diagram of an example non-limiting system 400 further comprising an atmospheric component 410 that adjusts an atmospheric condition within chamber component 130, wherein the atmospheric condition comprises at least one of a temperature, a pressure, a climate, or an atmospheric chemical composition. In an aspect, the conditions within chamber component 130 can be adjusted (e.g., using atmospheric component 410) in order to affect the SMAT of a material surface. In an instance, atmospheric component 410 can adjust a temperature, humidity, pressure level, airflow, atmospheric composition, and light emission within chamber component 130. By adjusting the atmospheric and environmental conditions within chamber component 130, atmospheric component 410 can impact the SMAT process within chamber component 130. For instance, the functionalization or doping of the material surface may be enhanced or diminished based on more or less light entering chamber component 310. Furthermore, in an aspect, adjustments to pressure levels within chamber component 310 can affect the force of impact between the set of balls and the material surface in particular instances. Additionally, depending on the type and composition of the material, a chemical or physical property change may occur by adjusting the temperature conditions within chamber component 310. Thus, atmospheric component 410 facilitates further customization of the SMAT process and its impact on the functionalization or doping of various materials.

Turning now to FIG's. 5-10, illustrated are methodologies or flow diagrams in accordance with certain aspects of this disclosure. While, for purposes of simplicity of explanation, the disclosed methods are shown and described as a series of acts, the disclosed subject matter is not limited by the order of acts, as some acts may occur in different orders and/or concurrently with other acts from that shown and described herein. For example, those skilled in the art will understand and appreciate that a methodology can alternatively be represented as a series of interrelated states or events, such as in a state diagram. Moreover, not all illustrated acts may be required to implement a method in accordance with the disclosed subject matter.

Figure 5:
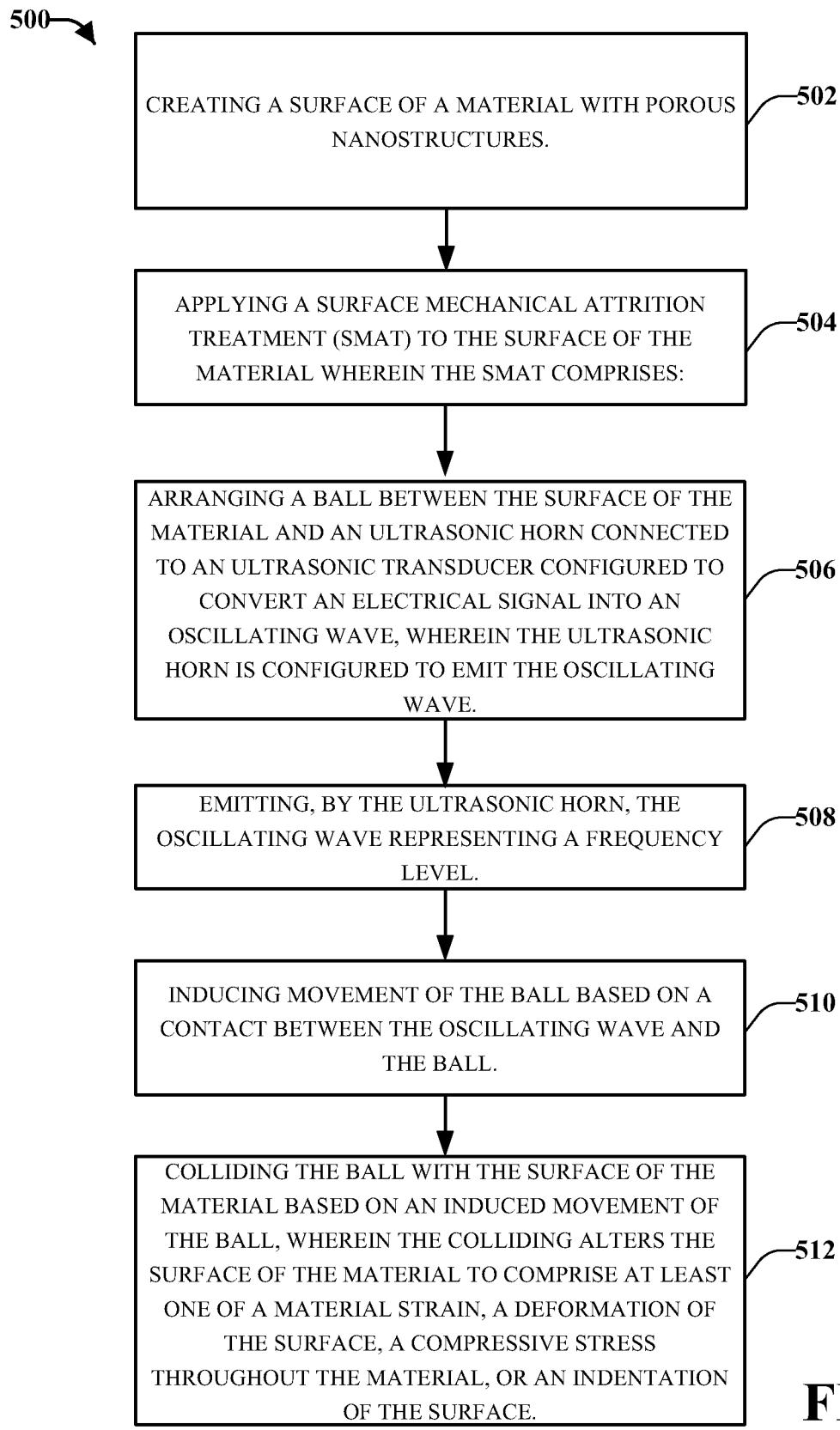
FIG. 5 illustrates a non-limiting example method of doping the surface of a material using SMAT.

Referring now to FIG. 5, presented is a flow diagram of a non-limiting example of a method 500 of SMAT on the surface of various materials disclosed in this description in accordance with an embodiment. At 502, porous nanostructures are created on the surface of a material. At 504, a surface mechanical attrition treatment (SMAT) is applied to the surface of the material. At 506, the SMAT comprises an arranging a ball between the surface of the material and an ultrasonic horn connected to an ultrasonic transducer configured to convert (e.g., using converter component 144) an electrical signal into an oscillating wave, wherein the ultrasonic horn is configured to emit (e.g., using horn component 142) the oscillating wave. At 508, the SMAT further comprises emitting (e.g., using horn component 142), by the ultrasonic horn, the oscillating wave representing a frequency level. At 510, the SMAT further comprises, inducing movement of the ball based on a contact between the oscillating wave and the ball. At 512, the SMAT further comprises, colliding the ball with the surface of the material based on an induced movement of the ball, wherein the colliding alters the surface of the material to comprise at least one of a material strain, a deformation of the surface, a compressive stress throughout the material, or an indentation of the surface.

Figure 6:
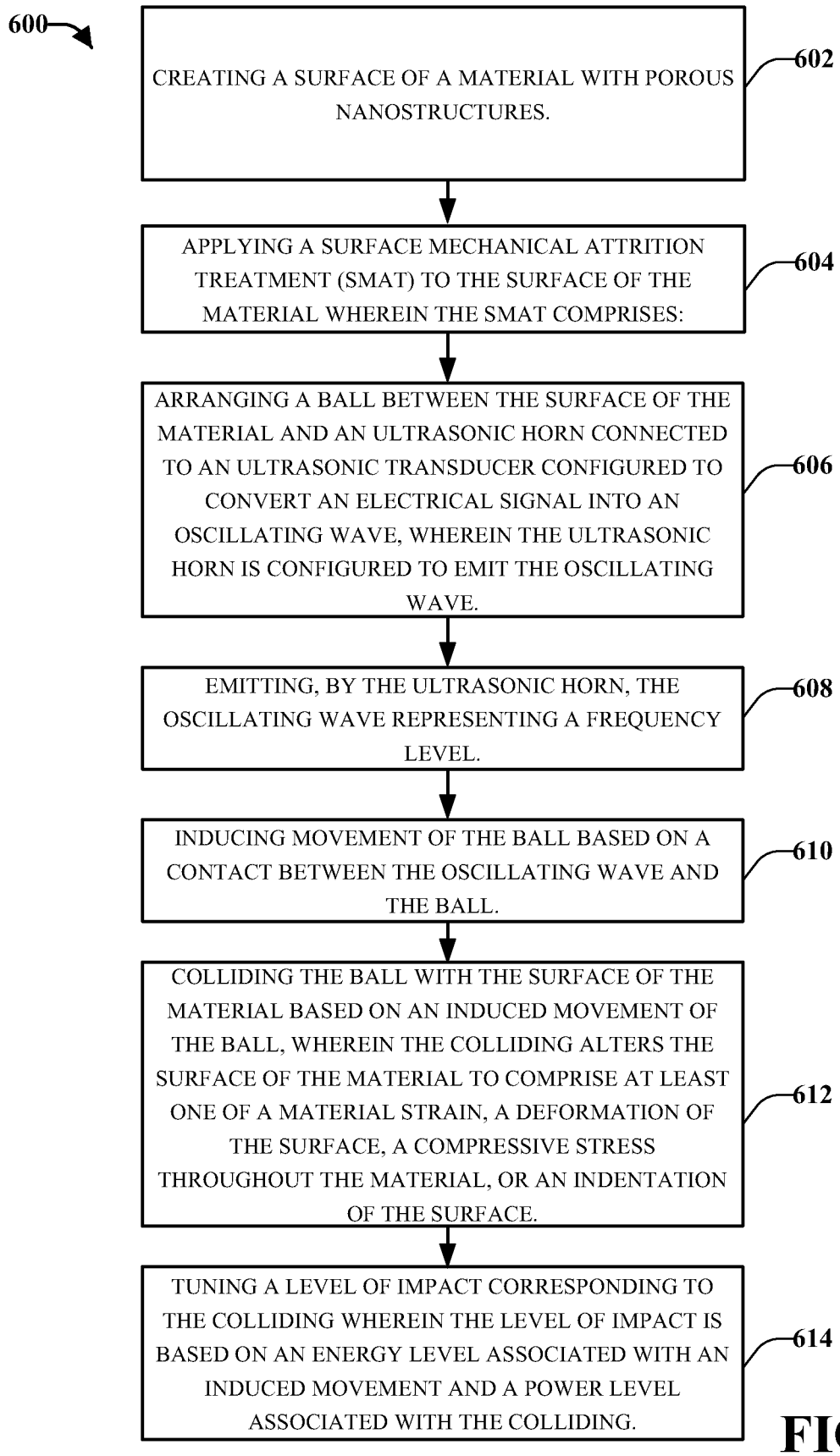
FIG. 6 illustrates a non-limiting example method of doping the surface of a material using SMAT.

Referring now to FIG. 6, presented is a flow diagram of a non-limiting example of a method 600 of SMAT on the surface of various materials disclosed in this description in accordance with an embodiment. At 602, porous nanostructures are created on the surface of a material. At 604, a surface mechanical attrition treatment (SMAT) is applied to the surface of the material. At 606, the SMAT comprises an arranging a ball between the surface of the material and an ultrasonic horn connected to an ultrasonic transducer configured to convert (e.g., using converter component 144) an electrical signal into an oscillating wave, wherein the ultrasonic horn is configured to emit (e.g., using horn component 142) the oscillating wave. At 608, the SMAT further comprises emitting (e.g., using horn component 142), by the ultrasonic horn, the oscillating wave representing a frequency level. At 610, the SMAT further comprises, inducing movement of the ball based on a contact between the oscillating wave and the ball. At 612, the SMAT further comprises, colliding the ball with the surface of the material based on an induced movement of the ball, wherein the colliding alters the surface of the material to comprise at least one of a material strain, a deformation of the surface, a compressive stress throughout the material, or an indentation of the surface. At 614, the SMAT further comprises, tuning (e.g., controller component 310) a level of impact corresponding to the colliding wherein the level of impact is based on an energy level associated with an induced movement and a power level associated with the colliding.

Figure 7:
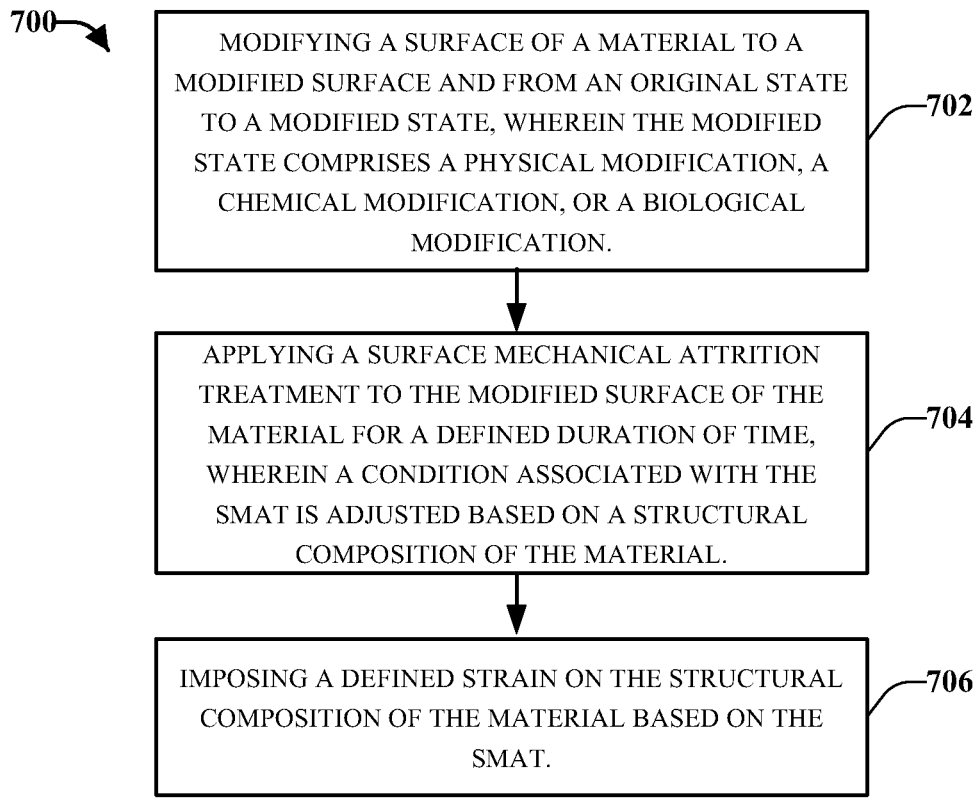
FIG. 7 illustrates a non-limiting example method of doping the surface of a material using SMAT.

Referring now to FIG. 7, presented is a flow diagram of a non-limiting example of a method 700 of SMAT on the surface of various materials disclosed in this description in accordance with an embodiment. At 702, a surface of a material is modified to a modified surface and from an original state to a modified state, wherein the modified state comprises a physical modification, a chemical modification, or a biological modification. At 704, a surface mechanical attrition treatment is applied to the modified surface of the material for a defined duration of time, wherein a condition associated with the SMAT is adjusted based on a structural composition of the material. At 706, a defined strain is imposed on the structural composition of the material based on the SMAT.

Figure 8:
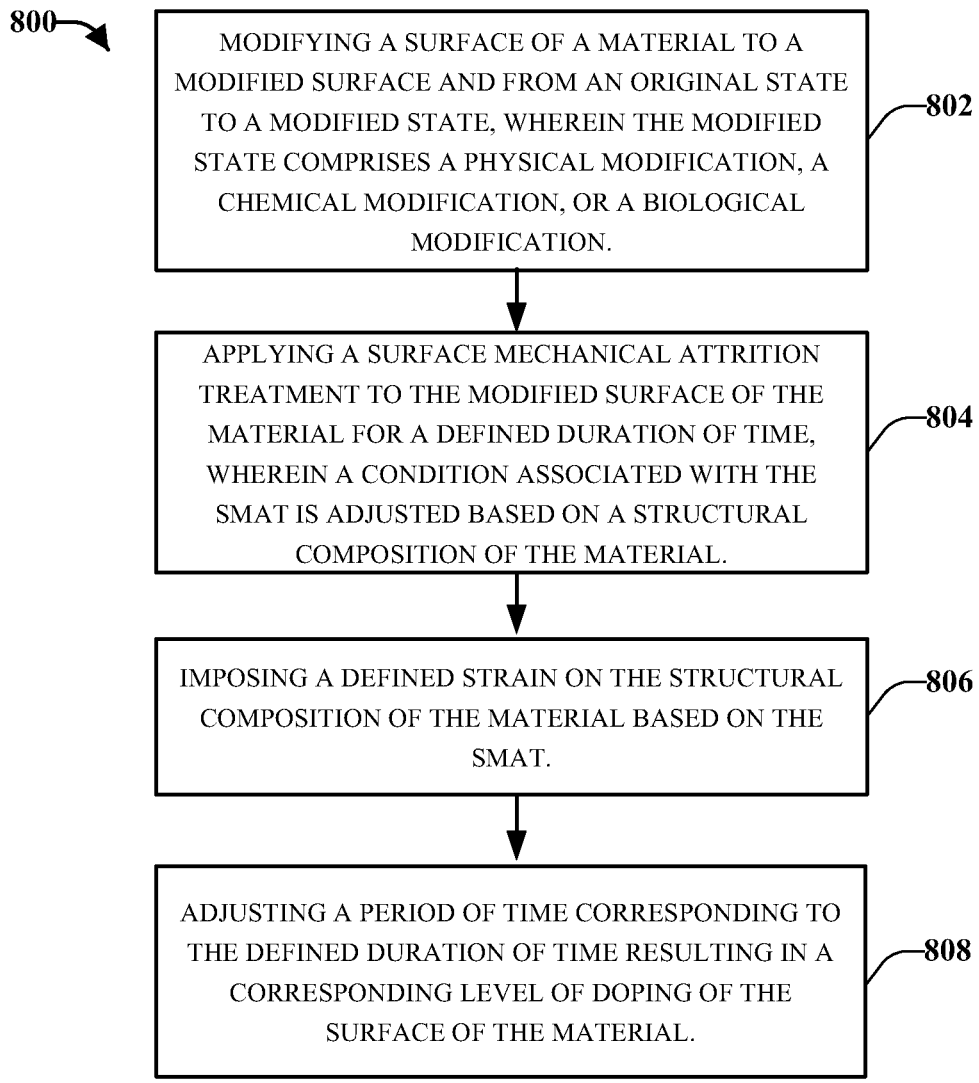
FIG. 8 illustrates a non-limiting example method of doping the surface of a material using SMAT.

Referring now to FIG. 8, presented is a flow diagram of a non-limiting example of a method 800 of SMAT on the surface of various materials disclosed in this description in accordance with an embodiment. At 802, a surface of a material is modified to a modified surface and from an original state to a modified state, wherein the modified state comprises a physical modification, a chemical modification, or a biological modification. At 804, a surface mechanical attrition treatment (SMAT) is applied to the modified surface of the material for a defined duration of time, wherein a condition associated with the SMAT is adjusted based on a structural composition of the material. At 806, a defined strain is imposed on the structural composition of the material based on the SMAT. At 808, a period of time corresponding to the defined duration of time resulting in a corresponding level of doping of the surface of the material.

Figure 9:
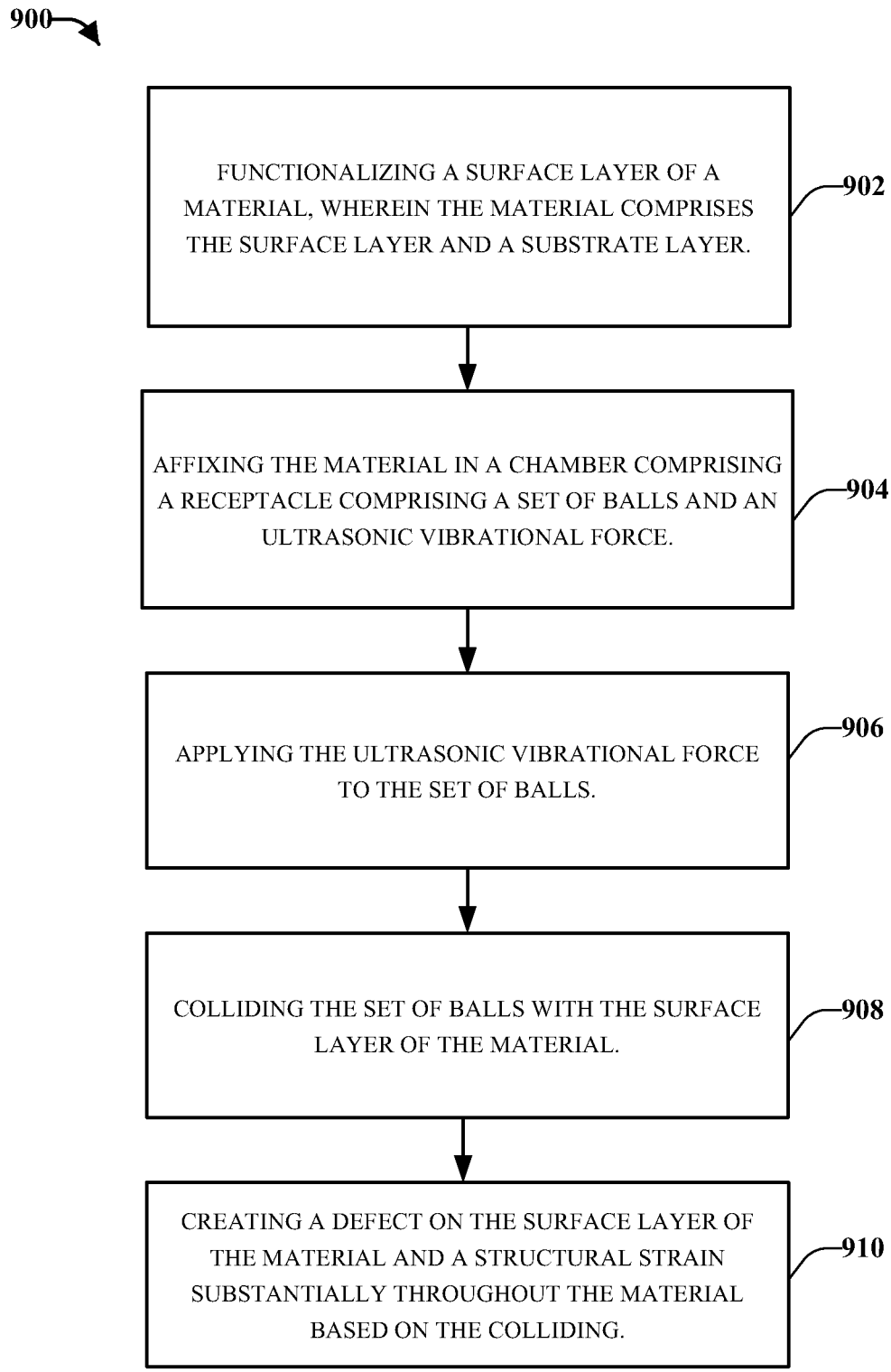
FIG. 9 illustrates a non-limiting example method of doping the surface of a material using SMAT.

Referring now to FIG. 9, presented is a flow diagram of a non-limiting example of a method 900 of SMAT on the surface of various materials disclosed in this description in accordance with an embodiment. At 902, a surface layer of a material is functionalized, wherein the material comprises the surface layer and a substrate layer. At 904, the material is affixed in a chamber comprising a receptacle comprising a set of balls and an ultrasonic vibrational force. At 906, the ultrasonic vibrational force is applied to the set of balls. At 908, the set of balls is collided with the surface layer of the material. At 910, a defect is created on the surface layer of the material and a structural strain substantially throughout the material based on the colliding.

Figure 10:
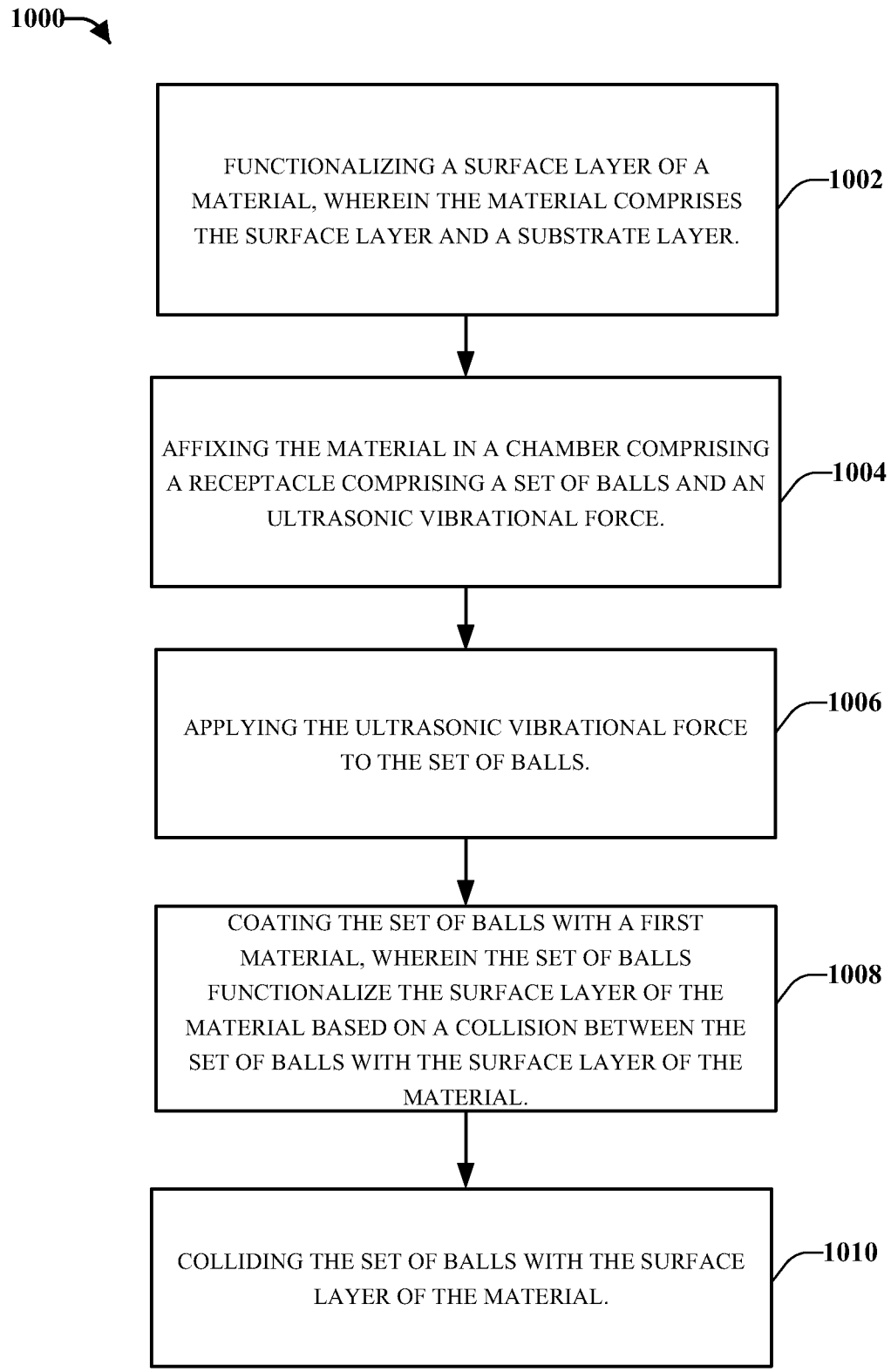
FIG. 10 illustrates a non-limiting example method of doping the surface of a material using SMAT.

Referring now to FIG. 10, presented is a flow diagram of a non-limiting example of a method 1000 of SMAT on the surface of various materials disclosed in this description in accordance with an embodiment. At 1002, a surface layer of a material is functionalized, wherein the material comprises the surface layer and a substrate layer. At 1004, the material is affixed in a chamber comprising a receptacle comprising a set of balls and an ultrasonic vibrational force. At 1006, the ultrasonic vibrational force is applied to the set of balls. At 1008, the set of balls are coated with a first material capable of functionalizing the surface layer of the material based on a collision between the set of balls with the surface layer of the material. At 1010, the set of balls is collided with the surface layer of the material.

In view of the exemplary systems and methods described above, methodologies that may be implemented in accordance with the described subject matter will be better appreciated with reference to the flowcharts of the various figures. While for purposes of simplicity of explanation, the methodologies are shown and described as a series of blocks, it is to be understood and appreciated that the claimed subject matter is not limited by the order of the blocks, as some blocks may occur in different orders and/or concurrently with other blocks from what is depicted and described in this disclosure. Where non-sequential, or branched, flow is illustrated via flowchart, it can be appreciated that various other branches, flow paths, and orders of the blocks, may be implemented which achieve the same or a similar result. Moreover, not all illustrated blocks may be required to implement the methodologies described hereinafter.

In addition to the various embodiments described in this disclosure, it is to be understood that other similar embodiments can be used or modifications and additions can be made to the described embodiment(s) for performing the same or equivalent function of the corresponding embodiment(s) without deviating there from. Accordingly, the invention is not to be limited to any single embodiment, but rather can be construed in breadth, spirit and scope in accordance with the appended claims.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

What has been described above includes examples of systems and methods that provide advantages of the subject innovation. It is, of course, not possible to describe every conceivable combination of components or methodologies for purposes of describing the claimed subject matter, but one of ordinary skill in the art may recognize that many further combinations and permutations of the various embodiments described herein are possible. Furthermore, to the extent that the terms "includes," "has," "possesses," and the like are used in the detailed description, claims, appendices and drawings, such terms are intended to be inclusive in a manner similar to the term "comprising" as "comprising" is interpreted when employed as a transitional word in a claim.

What is claimed is:

1. A system, comprising:
 a chamber configured to hold an object therein comprising a surface layer and a substrate layer;
 a set of balls provided within the chamber;
 an ultrasonic vibration generator connected to the chamber and comprising:
  a converter component configured to receive an electrical signal and convert the electrical signal into an oscillating wave; and
  a horn component configured to emit the oscillating wave toward the set of balls at a vibrational frequency, defined by a controller, that causes the set of balls to collide with the surface layer of the object at a target impact level that results in a rearrangement of atoms of the surface layer into a lattice structure, wherein the target impact level is less than an impact level that results in more than the rearrangement of the atoms of the surface layer into the lattice structure; and an anodization component configured to pass a current through the surface layer to anodize the surface layer.

2. The system of claim 1, wherein the target impact level does not result in structural changes to one or more layers of the object other than then surface layer, and wherein the one or more layers include the substrate layer.

3. The system of claim 1, wherein the target impact level does not result in indentations in the surface layer.

4. The system of claim 1, wherein the rearrangement of the atoms of the surface layer into the lattice structure increases a charge trapping property.

5. The system of claim 1, further comprising:
a heating component that applies heat according to a defined temperature to the surface layer.

6. A system, comprising:
a chamber configured to contain an object comprising a surface layer and a substrate layer;
a set of balls provided within the chamber; and
an ultrasonic vibration generator connected to the chamber and comprising:
a converter component configured to receive an electrical signal and convert the electrical signal into an oscillating wave;
a horn component configured to emit the oscillating wave toward the set of balls at a defined ultrasonic vibrational force, specified by an output of a controller, that causes the set of balls to collide with the surface layer of the object at a target speed that results in a rearrangement of atoms of the surface layer into a lattice structure, wherein the target speed level is less than a speed that results in structural changes to one or more layers of the object other than then surface layer, and wherein the one or more layers comprise the substrate layer; and
an anodization component configured to pass a current through the surface layer to anodize the surface layer.

7. The system of claim 6, wherein the target speed does not result in more than the rearrangement of the atoms of the surface layer into the lattice structure.

8. The system of claim 6, wherein the target speed does not result in indentations in the surface layer.

9. The system of claim 6, wherein the rearrangement of the atoms of the surface layer into the lattice structure increases a charge trapping property of the surface layer.

10. The system of claim 6, wherein the object comprises a thin film.

11. The system of claim 10, wherein the surface layer comprises nanostructures.

12. A system, comprising:
a chamber that holds an object comprising a surface layer and a substrate layer;
balls provided within the chamber; and
an ultrasonic vibration generator connected to the chamber and comprising:
a power generator that converts a power stream to an electrical signal;
a converter component that converts the electrical signal to an oscillating wave; and
a horn component that emits the oscillating wave toward the balls at a target vibrational frequency, specified by a controller, that induces collision of the balls with the surface layer of the object at a target speed that results in a rearrangement of atoms of the surface layer into a lattice structure, wherein the target speed level is less than a speed that results in structural changes to one or more layers of the object other than then surface layer, and wherein the one or more layers comprise the substrate layer,
an anodization component that passes a current via the surface layer to anodize the surface layer; and
a heating component that applies heat according to a defined temperature to the surface layer.

13. The system of claim 12, wherein the chamber comprises:
a material housing portion connected to a ceiling of the chamber that holds the object; and
a receptacle portion connected to a floor of the chamber opposite the ceiling that contains the balls, and wherein the horn component is connected to the receptacle portion.

14. The system of claim 12, wherein the chamber has a geometrical shape selected from the group consisting of: a cylinder, a cube, a cone, a sphere, a pyramid, a cuboid, a triangular prism, a hexagonal prism, a hemisphere, a dodecahedron, an irregular three-dimensional shape, and a flat-topped three-dimensional shape.

15. The system of claim 12, further comprising:
a modification component that adjusts a dimension of the chamber to achieve the target speed.

16. The system of claim 12, further comprising:
a controller component that controls a power supply level of the power stream to control emission of the oscillating wave at the target vibrational frequency.

17. The system of claim 12, wherein the balls are formed with a material selected from a group consisting of: a metal material, a ceramic material, a semiconductor material, and a plastic material.

18. The system of claim 12, further comprising:
an atmospheric component that adjusts an atmospheric condition within the chamber, wherein the atmospheric condition comprises at least one of a temperature, a pressure, a climate, or an atmospheric chemical composition.

19. The system of claim 12, wherein the rearrangement of the atoms of the surface layer into the lattice structure increases a charge trapping property of the surface layer.

20. The system of claim 12, wherein the object comprises a thin film and wherein the surface layer comprises nanostructures.

* * * * *